United States Patent
Permana et al.

(10) Patent No.: US 6,709,974 B2
(45) Date of Patent: Mar. 23, 2004

(54) METHOD OF PREVENTING SEAM DEFECTS IN ISOLATED LINES

(75) Inventors: David Permana, Dallas, TX (US);
Jiong-Ping Lu, Richardson, TX (US);
Albert Cheng, Richardson, TX (US);
Jeff A. West, Dallas, TX (US); Brock W. Fairchild, Allen, TX (US); Scott A. Johannesmeyer, Richardson, TX (US);
Chris M. Bowles, Plano, TX (US);
Thomas D. Bonifield, Dallas, TX (US);
Rajesh Tiwari, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/322,763

(22) Filed: Dec. 19, 2002

(65) Prior Publication Data

US 2003/0199150 A1 Oct. 23, 2003

Related U.S. Application Data

(63) Continuation-in-part of application No. 10/123,528, filed on Apr. 17, 2002, now abandoned.

(51) Int. Cl.$^7$ .......................................... H01L 21/4763
(52) U.S. Cl. ..................... 438/633; 438/637; 438/687
(58) Field of Search ............................... 438/631, 633, 438/637, 678, 687, 691, 692, 926

(56) References Cited

U.S. PATENT DOCUMENTS

| | | | | |
|---|---|---|---|---|
| 5,905,289 A | * | 5/1999 | Lee | 257/368 |
| 6,001,733 A | * | 12/1999 | Huang et al. | 438/633 |
| 6,178,543 B1 | * | 1/2001 | Chen et al. | 716/19 |
| 6,232,231 B1 | * | 5/2001 | Sethuraman et al. | 438/691 |
| 6,380,087 B1 | * | 4/2002 | Gupta et al. | 438/692 |
| 6,465,342 B1 | * | 10/2002 | Taguchi et al. | 438/623 |
| 2002/0106837 A1 | * | 8/2002 | Cleeves et al. | 438/129 |

* cited by examiner

*Primary Examiner*—T. N. Quach
(74) *Attorney, Agent, or Firm*—W. James Brady, III; Frederick J. Telecky, Jr.

(57) ABSTRACT

A method of preventing seam defects on narrow, isolated lines of 0.3 micron or less during CMP process is provided. The solution is to change the size of features of dummy metal structures on the same layer as the metal layer to have a width that is about 0.6 micron or less so that during the electroplating the deposition rate in the features is similar to the narrow, isolated lines. The density, shape, and proximity of the dummy metal structures further prevents the seam defects during CMP processing by preventing Galvanic corrosion.

14 Claims, 3 Drawing Sheets

METHOD OF PREVENTING SEAM DEFECTS IN ISOLATED LINES

CROSS-REFERENCE TO RELATED APPLICATION

This application is a continuation-in-part application of application Ser. No. 10/123,528 filed Apr. 17, 2002, entitled "Method of Preventing Seam Defects in Isolated Lines" now abandoned.

FIELD OF INVENTION

This invention relates to semiconductor devices utilizing copper metallization, particularly to Chemical Mechanical Planarization (CMP) of copper interconnect lines, and to preventing seam defects in narrow, isolated metal lines.

BACKGROUND OF INVENTION

The manufacturing of semiconductor devices often includes layers of electrical circuits and/or dielectric on top of a semiconductor substrate. The electrical circuits often include narrow, isolated conductive interconnect lines circuits on one or more layers on the semiconductor substrate. The one or more layers of electrical lines and/or dielectric layers undergo Chemical Mechanical Polishing (CMP). The polishing polishes excess metal in a damascene process where holes are formed in a dielectric layer and copper is electroplated in and over the holes and on the top surface of the dielectric before the polishing. The polishing includes for example a wafer on a rotating head pressed against a polishing pad that is also rotating to grind down or polish the surface to present a more uniform planar surface. A more planar surface significantly aids the photolithography process. Dummy metals, with an appropriate size, shape, and density, promote uniform within-wafer, and particularly within-die, CMP planarization. Dummy metal structures are added to regions of low metal density. The dummy metal process involves forming holes of a given shape in the glass and electroplating copper into the holes. The copper electrochemical deposition (ECD) rate depends upon the feature size of the holes being plated.

Dummy metals are not connected to any electrical signal lines although they may be connected to ground. They are generally designed to fill a dielectric space where there is no interconnect metal so the polisher sees more uniform local metal density that will provide a more planar polished surface.

A severe seam defect problem has been observed at post CMP defect inspection. The problem occurs specifically in features that are narrow, isolated and electrically floating after the polishing is complete.

SUMMARY OF INVENTION

In accordance with one embodiment of the present invention, the shape, size, and density of the dummy metal structures are designed specifically when are used to surround narrow, isolated lines so that homogeneous metal density distribution across the area promotes uniform planarization rate, and consequently prevents seam defects.

In accordance with another embodiment of the present invention a method of preventing seam defects on narrow, isolated lines in the active region during CMP process with dummy metal structures includes providing with the narrow, isolated line dummy metal structures with features thereof of widths to have fill up rates that match the narrow, isolated line with a certain density of said dummy metal structures on the semiconductor device In accordance with another embodiment of the present invention determining if the narrow, isolated line has a line width of 0.3 micron or less and if so providing dummy metal structures with features that have line widths of 0.6 micron or less.

DESCRIPTION OF PREFERRED EMBODIMENT OF THE PRESENT INVENTION

Figure 1:
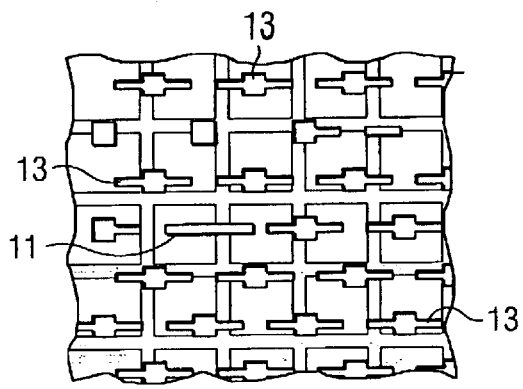
FIG. 1 illustrates a prior art wafer surface with dummy metal structures and narrow, isolated interconnect line.
Figure 4:
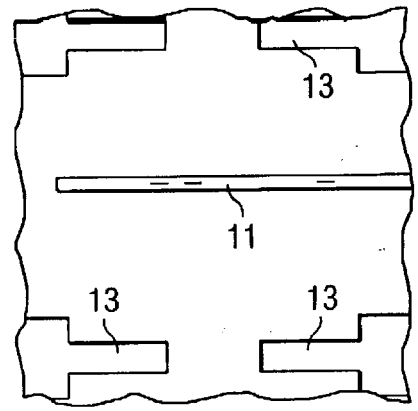
FIG. 4 illustrates a detail of FIG. 1 illustrating a narrow, isolated line and dummy metal after polishing.
Figure 2:
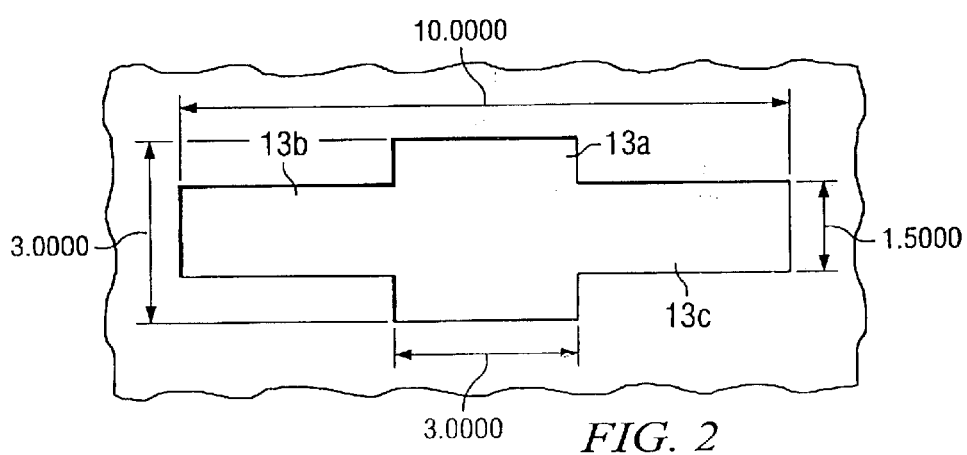
FIG. 2 illustrates the dimensions of a dummy metal structure illustrated in FIG. 1.
Figure 3:
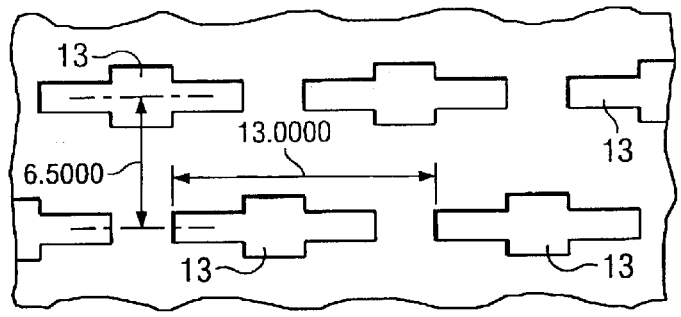
FIG. 3 illustrates the spacing between dummy metal structures of FIG. 1.
Figure 5:
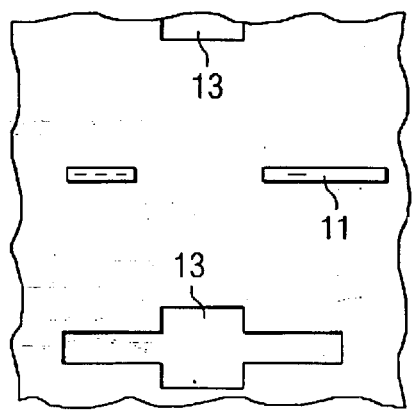
FIG. 5 illustrates another prior art seam defect in narrow, isolated lines adjacent dummy metal structures after polishing.

FIG. 1 illustrates a narrow, isolated interconnect line 11 surrounded by dummy metal structures 13. The term narrow line herein refers to lines that are 0.3 microns or less in width. The term isolated line refers to lines 1.5 microns from the nearest other line. FIG. 2 illustrates the size and shape of a preferred prior art dummy metal structure 13 used by Tex. Instruments Inc. The dummy metal structure 13 has a square center portion 13a and two thinner wings or arms 13b and 13c extending in opposite directions from the center portion 13a. The long dimension including the center portion 13a and the wings 13b and 13c is 10 microns. The broad center portion 13a is 3×3 micron and the narrow wings are each 3.5 microns long and 1.5 microns wide. The vertical pitch of the dummy metal structures as illustrated in FIG. 3 is 6.5 microns and the horizontal pitch is 13 microns between structures. The structures and pitches are selected to present uniform capacitance to active lines in the metal layer(s) above and/or below the layer containing the dummy metal FIG. 4 illustrates a detail section of FIG. 1 illustrating the isolated line 11 and shaped dummy metal structures 13. FIGS. 4 and 5 illustrate seam defects in isolated lines following CMP processing with the dummy metal structure 13 in FIGS. 1–3 where isolated lines 11 are about 0.24 micron in width for example.

It has been discovered that the role of dummy metal becomes crucial in narrow, isolated interconnect line regions because the narrow, isolated lines can be susceptible to Galvanic corrosion resulting from non-uniform planarization rates. Proper selection of dummy metal features with certain size, shape, density and placement can alleviate this problem to provide a more uniform planarization rate. The electroplating process is designed to provide a "superfill" condition for line widths that are less than about 0.6 micron, in which the deposition rate is significantly higher than the rate of fill for larger features.

Figure 6:
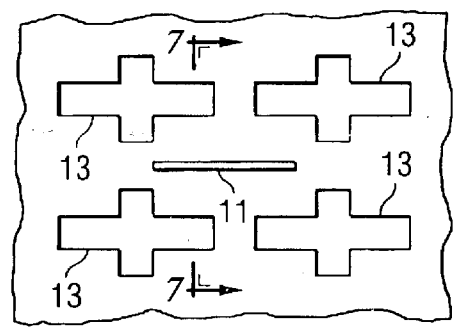
FIG. 6 illustrates a sketch of an isolated line and surrounding dummy metal structure in the prior art and where the cross-section A-A' in FIGS. 5 and 6 are taken.
Figure 7:
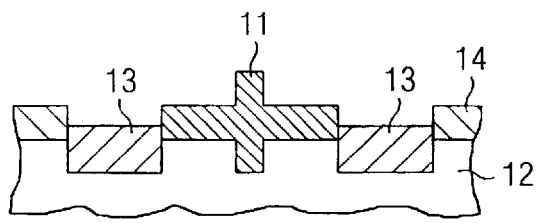
FIG. 7 illustrates post ECD showing protrusion on small feature (isolated line) in the prior art.
Figure 8:
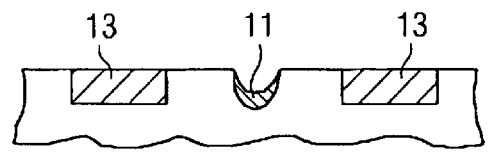
FIG. 8 illustrates the prior at post CMP with seam defect on isolated line.

FIGS. 6 through 8 illustrates the cause of seam defect on a narrow, isolated line 11. FIG. 6 illustrates a sketch of the isolated line 11 and the dummy metal structure 13 and where a cross section A-A' is taken for illustrating FIGS. 7 and 8. FIG. 7 illustrates schematically post copper ECD. The superfill condition for features with width of about 0.6 micron or less can lead to protrusions over these features. In some cases these protrusions can be extreme. These protrusions do not occur over the dummy metal structures 13 described above in connection with FIGS. 1–5. Larger features generally fill conformably during ECD.

It has been found that after CMP Galvanic corrosion leads to creation of a seam defect that occurs on the isolated, narrow line. Between the silicon dioxide on the semiconductor substrate 12 and the copper is a tantalum based barrier layer 14. At a point in the polishing process some of the tantalum based barrier layer is exposed that is sufficiently spaced from the copper on the isolated line 11 such that with the polishing slurry with a pH of about 7.3 a voltage is developed that causes Galvanic corrosion. This produces the seam defects. As sketch detail shown in FIG. 8 illustrates, the seam defect is observed at the isolated line 11 following CMP processing.

In accordance with the present invention, by the proper selection of dummy metal features with certain size, shape, density, and placement, this problem can be alleviated.

Figure 9:
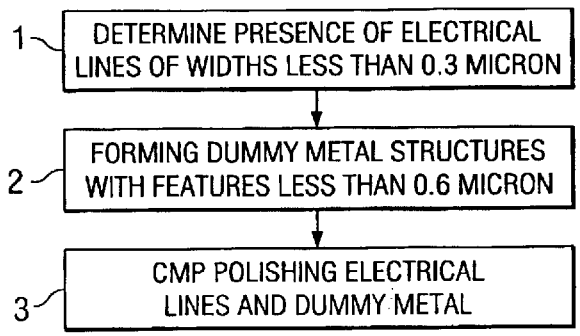
FIG. 9 illustrates the method according to one embodiment of the present invention.

FIG. 9 illustrates the improved method of dummy metal design for CMP of a semiconductor body, utilizing copper metallization. The method illustrates the Step 1 of determining the presence of narrow, isolated, electrically floating copper metal lines or portions thereof about 0.3 micron or less and Step 2 of forming dummy metal structures surrounding the narrow, isolated, electrically floating lines having features or portions thereof having line widths 0.6 micron or less to superfill like the isolated lines to promote homogeneous distribution of metal density and copper protrusions across the area. The smaller dummy metal structures should also be sufficiently close to the narrow, isolated line to prevent Galvanic corrosion.

In accordance with the present invention, the shape of dummy metal structures in Step 2 is made to incorporate sub 0.6 micron features that provide superfill conditions during ECD. The dummy metal density, size, and spacing to narrow, isolated metal lines are designed specifically for the dimension of small features so that uniform CMP planarization rate is achievable across the area. The protrusion of copper over dummy metal is similar to the isolated lines, and during CMP copper is cleared from the tantalum based barrier more uniformly to prevent Galvanic corrosion. The dummy metal structures 13a can be conveniently created simultaneously with the circuit metal. Following Step 2 is the Step 3 of CMP polishing the narrow, isolated line and dummy metal structures.

Figure 10:
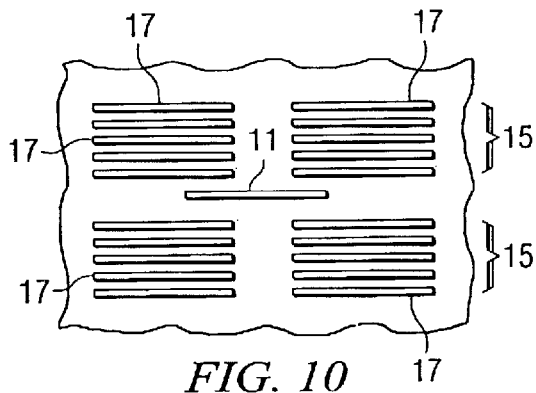
FIG. 10 illustrates the design of the dummy metal according to one embodiment of the present invention.

FIG. 10 illustrates an example for the design of the dummy metal structures 15 being a grouping or pattern of metal lines 17 to replace the broad dummy metal island structure. The density of the dummy metals has to be such that it promotes uniform planarization rate across the area and minimize the Galvanic corrosion. Each of the narrow lines 17 of the dummy metal structures 15, however, is individually similar to the narrow, isolated line 19 in shape and is less than 0.6 micron. If the width of the narrow, isolated line is 0.3 micron or less the dummy metal lines 17 have a width of 0.6 micron or less. When copper ECD is performed on these dummy features, copper protrusions can be expected in a similar manner as the small dense structure. Copper ECD superfills these structures and protrudes uniformly across the die, leading to a more uniform planarization rate. The density of the metal lines and closeness of the dummy metal lines to the narrow, isolated line eliminates Galvanic corrosion. The problem of the narrow, isolated line being aggressively attacked during CMP is, therefore, eliminated. It is recognized that the size and shape of the isolated line or similar line may be other than that illustrated.

Figure 11:
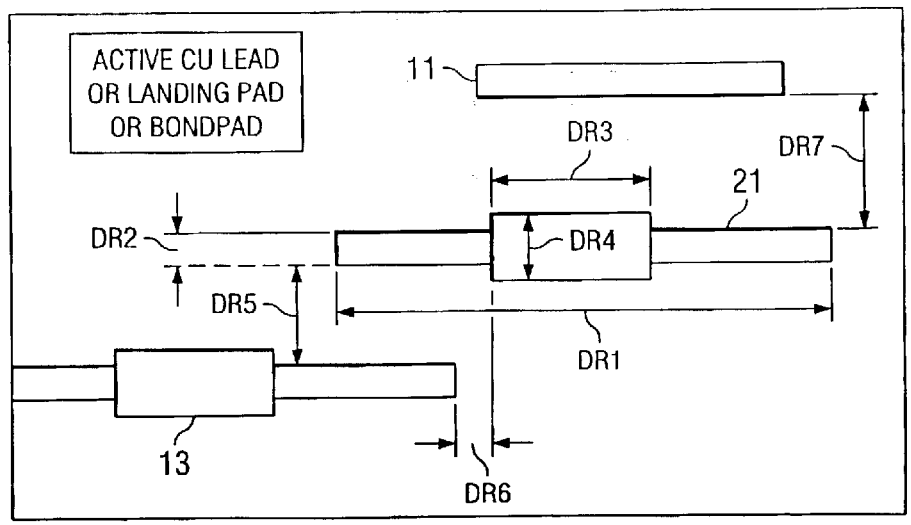
FIG. 11 illustrates the design of the dummy metal structure according to a preferred embodiment of the present invention.

In accordance with a preferred embodiment of the present invention the dummy metal structure 13 in FIG. 1 is reduced in size and spacing. It has been found that by reducing the dummy metal structure of FIGS. 1–3 and proportionately reducing the spacing between the dummy metal structures the average fill up rate for the dummy metal matches the average fill up rate of the overall electrical structure including the narrow, isolated lines. This is illustrated by a preferred embodiment in FIG. 11. For the case of narrow, isolated lines 11 with widths less than 0.3 micron the dimensions of the dummy metal 21 in FIG. 11 are as follows:

Horizontal total length DR1=7.8 um

Horizontal width of central body DR3=1.8 um

Vertical width of wings DR2=0.5 um

Vertical width of central body DR4=1.3 um

Dummy metal to dummy metal space DR5=1.0 um

Dummy metal to dummy metal stagger DR6=0.2 um

Space of dummy metal to active landing pads or bondpads with area>1.2 um2

DR7=1.0 um and if<1.2 um2 DR7=0.8 um.

Vertical Pitch=1.5 um

Horizontal pitch=4.1 um

Area of dummy metal=35.6%.

The dummy metal is oriented parallel to predominant active metal on each level. The dummy metal is rotated 90 degrees on alternate metal levels. The dummy metal is absent in scriblines and SRAMS. The dummy metal is excluded when it aligns to active metal on the levels one above or one below.

The cause of the seam defects when the isolated line is less than about 0.3 micron is eliminated by changing the width of a proportionate amount of the dummy metal structures to be less than 0.6 micron. It has been determined that in the preferred embodiment that the same dummy metal shape illustrated in FIGS. 1–3 be used but reduced so the narrow widths at the wings are about 0.5 micron. In this manner the size of the dummy metal structures is similar to isolated lines and other lines in active regions.

Although an embodiment of the present invention has been described, one of ordinary skill will realize numerous variations and modifications are possible without departing from the spirit and scope of the present invention. Accordingly, reference should be made to the appended claims to ascertain the scope of the present invention.

In the claims:

1. A method of preventing seam defects on narrow, isolated active lines in the active region on a semiconductor device layer during CMP polishing process comprising the steps of:

determining if a narrow, isolated active line has a width that is 0.3 micron or less and said isolated active line is more than 0.7 micron from another active line and, if so, providing dummy metal structures with narrow metal features having widths of 0.6 micron or less to have fill up rates that match the narrow, isolated active lines on said semiconductor device layer and CMP polishing said isolated active line and said dummy metal structures.

2. The method of claim 1 wherein said dummy metal structures are of a density and spacing from said narrow, isolated active lines to prevent Galvanic corrosion when CMP polishing.

3. The method of claim 2 wherein said dummy metal structures are in the shape of a block with narrow wings extending on opposite ends of said block to present uniform capacitance to active lines in the metal layer or layers above and/or below the layer containing the dummy metal.

4. The method of claim 3 wherein said dummy metal structures have said narrow wings with a narrow width dimension of 0.6 microns or less to have fill up rates that match the narrow, isolated active lines on said semiconductor device layer.

5. The method of claim 2 wherein the spacing between dummy metal structures is about 1.0 micron.

6. The method of claim 5 wherein said dummy metal structures are staggered from row to row and the stagger is about 0.2 micron.

7. The method of claim 6 wherein said space of dummy metal structures to active landing pads or bond pads with area $>1.2\,\mu m^2$ is about 1 micron and if $<1.2\,\mu m^2$ is about 0.8 micron.

8. The method of claim 1 wherein said isolated line is 1.5 micron from another active line.

9. The method of claim 8 wherein said dummy metal structures are of a density and spacing from said narrow, isolated active lines to prevent Galvanic corrosion when CMP polishing.

10. A method of preventing seam defects in narrow, isolated active metal lines in the active region of a layer on a semiconductor substrate during CMP process comprising the steps of:

forming holes on a dielectric layer on said semiconductor substrate of a shape to provide said narrow, isolated active metal lines that have widths that are 0.3 micron or less and are more than 0.7 micron from another active line in the active regions of said dielectric layer and forming holes on said dielectric layer of a shape to provide dummy metal structures having metal features thereof with widths 0.6 micron or less utilizing copper metallization;

electroplating copper into said holes to form said narrow, isolated active metal lines and said dummy metal structures; and CMP polishing said narrow, isolated lines and said dummy metal structures to remove excess copper.

11. The method of claim 10 wherein the shape of said holes to form said dummy metal structures is such that each of said dummy metal structures formed comprise a rectangular center portion and a wing portion extending from opposite ends of the rectangular center portion and with each wing having widths of about 0.6 micron or less to present superfill protrusions to match those of the narrow, isolated active lines.

12. The method of claim 10 wherein said holes to form said dummy metal structures are of a density and spacing from said narrow, isolated active lines to prevent Galvanic corrosion during CMP polishing following electroplating copper into said holes to remove excess copper.

13. A method of preventing seam defects on active narrow, isolated lines where the active narrow lines have widths that are 0.3 micron or less and are 1.5 micron from another active line in the active region on a semiconductor device layer during CMP polishing process comprising the steps of:

providing dummy metal structures with features thereof of widths 0.6 micron or less to have fill up rates that match the narrow, isolated lines on said semiconductor device layer and CMP polishing said isolated lines and said dummy metal structures.

14. The method of claim 13 wherein said dummy metal structures are of a density and spacing from said narrow, isolated active lines to prevent Galvanic corrosion when CMP polishing.

* * * * *